US006928725B2

(12) United States Patent
Wu et al.

(10) Patent No.: US 6,928,725 B2
(45) Date of Patent: Aug. 16, 2005

(54) METHOD FOR PACKING ELECTRONIC DEVICE BY INTERCONNECTING FRAME BODY AND FRAME LEADS WITH INSULATING BLOCK AND ITS PACKING STRUCTURE

(75) Inventors: Chung-Chen Wu, Taoyuan Hsien (TW); Ming-Tzu Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 81 days.

(21) Appl. No.: 10/715,585

(22) Filed: Nov. 17, 2003

(65) Prior Publication Data

US 2004/0095737 A1 May 20, 2004

Related U.S. Application Data

(62) Division of application No. 09/741,239, filed on Dec. 19, 2000, now abandoned.

(30) Foreign Application Priority Data

Jul. 13, 2000 (TW) ....................................... 89115354 A

(51) Int. Cl.[7] ................................................. H05K 3/20

(52) U.S. Cl. ........................................................ 29/831

(58) Field of Search .......................... 336/65, 183, 192, 336/200; 29/602.1, 829–845; 257/666–676

(56) References Cited

U.S. PATENT DOCUMENTS

| | | | | | |
|---|---|---|---|---|---|
| 3,370,203 | A | * | 2/1968 | Kravitz et al. | 361/730 |
| 5,338,899 | A | | 8/1994 | Gainey | 174/52.4 |
| 5,345,670 | A | | 9/1994 | Pitzele et al. | 29/606 |
| 5,396,032 | A | * | 3/1995 | Bonham et al. | 174/52.4 |
| 5,661,900 | A | * | 9/1997 | McLellan et al. | 29/827 |
| 5,692,296 | A | * | 12/1997 | Variot | 29/827 |
| 5,939,775 | A | * | 8/1999 | Bucci et al. | 257/667 |
| 6,332,269 | B1 | * | 12/2001 | Gamel et al. | 29/833 |

* cited by examiner

*Primary Examiner*—Tuyen T Nguyen
(74) *Attorney, Agent, or Firm*—Birch, Stewart, Kolasch & Birch, LLP

(57) ABSTRACT

A packing structure of an electronic device by interconnecting a frame and frame leads with an insulating block is provided. The packing structure has the advantage of measuring the electrical characteristics of the semi-product before being subject to a plastic molding. The packing structure includes a frame having a package area where an electronic device is disposed, an insulating block disposed on one side of the package area and connected to the frame, and a plurality of frame leads aligned in parallel and connected to the insulating block and the electronic device.

20 Claims, 10 Drawing Sheets

METHOD FOR PACKING ELECTRONIC DEVICE BY INTERCONNECTING FRAME BODY AND FRAME LEADS WITH INSULATING BLOCK AND ITS PACKING STRUCTURE

This is a divisional application of U.S. patent application Ser. No. 09/741,239, filed on Dec. 19, 2000 now abandoned, which is herein incorporated by reference for all purposes.

FIELD OF THE INVENTION

The present invention relates to a method for packing an electronic device, more particularly to a method for packing an electronic device by interconnecting a frame and frame leads with an insulating block. The present invention also relates to a packing structure that serves to directly measure the electrical properties of the semi-product before being subject to a plastic molding and prevent undesirable defects of the products.

BACKGROUND OF INVENTION

A traditional method for packing an electronic device generally includes the steps of providing a frame having a plurality of frame leads arranged in parallel, interconnecting an electronic device and the frame leads through a plurality of metal wires, applying a filling medium on the surface of the electronic device, and further performing a plastic molding process to form a semi-product. Referring to FIG. 1 and FIG. 2, a typical frame essentially includes two major components: a plurality of frame leads 1 and a frame body 2. As shown in FIG. 2, the semi-product before being subject to a plastic molding is generally formed by welding an electronic device 3 to the frame leads 1 which are connected to the frame body 2. After performing a plastic molding process, the semi-product before being subject to a plastic molding is then packed into a semi-product as shown in FIG. 3. Referring to FIG. 4, the product is formed by undergoing the typical back-end procedures, for example, the cutting of the frame portion and the bending of the leads.

However, the customarily used packing structure has a disadvantage that measuring the electric characteristics of the semi-products before being subject to a plastic molding or the semi-products is impossible. Thus, it is difficult to increase the yield of products by using such type of packing structure and the defective products caused by welding are usually not reusable.

Therefore, the present invention provides a method for packing an electronic device by interconnecting a frame and frame leads with an insulating block and also provides a novel packing structure to overcome the aforementioned problems.

SUMMARY OF THE INVENTION

An object of the present invention is to provide a packing structure and a method for packing an electronic device with the advantage of measuring the electrical characteristics of the semi-product before being subject to a plastic molding.

Another object of the present invention is to provide a packing structure and a method for packing an electronic device with the advantages of detecting and preventing the defective semi-product before being subject to a plastic molding.

A further object of the present invention is to provide a packing structure and a method for packing an electronic device with the advantages of increasing the yield and reliability of the product.

A specified designed packing structure of an electronic device by interconnecting a frame and frame leads with an insulating block can achieve, the above objects of the present invention. The packing structure includes: a frame having a package area where an electronic device is disposed therein, an insulating block disposed on one side of the package area and connected to the frame, and a plurality of frame leads aligned in parallel and connected to the insulating block and the electronic device.

In accordance with an aspect of the present invention, the electronic device includes a coil or a functional block having circuits thereon.

Preferably, the electronic device is a coil.

Preferably, the frame is made of metal.

Preferably, the package area is preferably disposed in the center of the frame and in a shape of a rectangle.

Preferably, the insulating block is formed by a plastic molding process.

Preferably, the plurality of leads are insulated with each other.

Preferably, the leads are connected to the electronic device through a plurality of wires.

Preferably, the plurality of frame leads has one end turned upwardly by about 90 degrees and embedded in the insulating block.

In accordance with another aspect of the present invention, there is provided a packing structure of an electronic device.

The packing structure includes a frame having a package area where an electronic device is disposed therein, an insulating block disposed on one side of the package area and connected to the frame, and a plurality of frame leads aligned in parallel and insulated with each other, each of the frame leads having one end embedded in the insulating block and the other end connected to the electronic device by a corresponding wire.

In accordance with another aspect of the present invention, there is also provided a method for packing an electrical device by interconnecting a frame and frame leads with an insulating block. The method includes the steps of providing a frame having a package area where an electronic device is disposed therein, a connecting arm and a plurality of frame leads which are connected to the connecting arm, forming an insulating block on one side of the package area, interconnecting the frame and the plurality of frame leads with the insulating block, partially cutting the connecting arm to insulate the plurality of frame leads against each other, and electrically connecting the electronic device to the plurality of frame leads.

These and various other features and advantages of the present invention will be readily understood with reference to the following detailed description taken in conjunction with the accompanying drawings, in which:

DETAILED DESCRIPTION OF THE PREFERRED EMBODIMENTS

Figure 1:
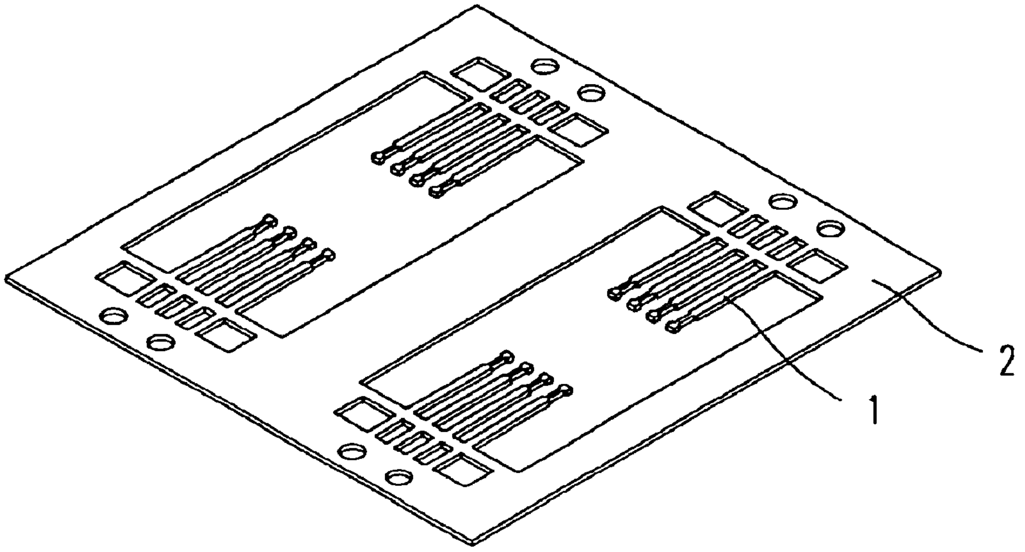
Fig. 1(PRIOR ART)
FIG. 1 is a perspective view showing a frame according to prior art.
Figure 2:
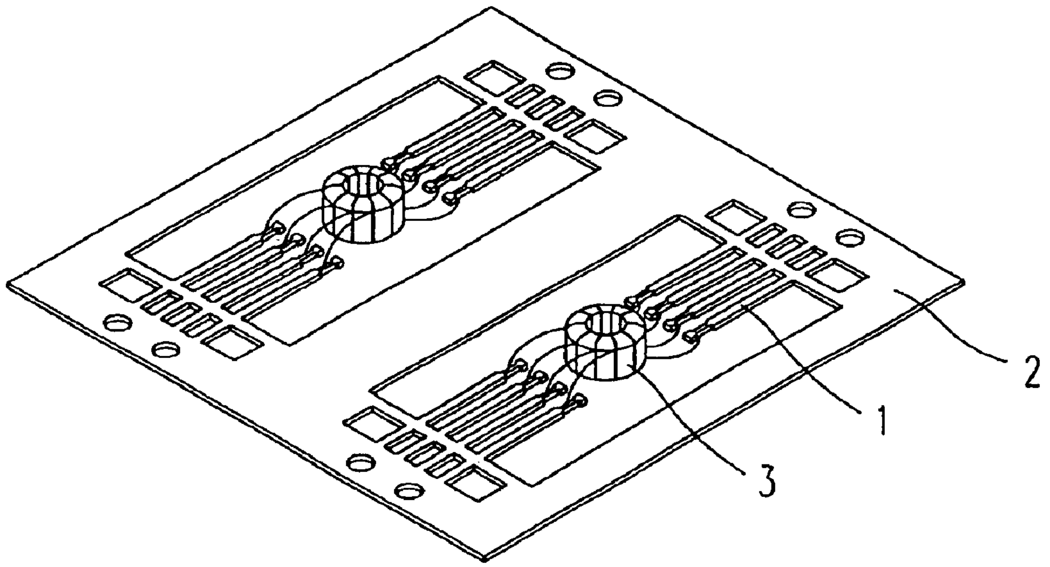
Fig. 2(PRIOR ART)
FIG. 2 is a perspective view showing a semi-product before being subject to a plastic molding according to prior art, wherein the electronic device is connected to the frame leads.
Figure 3:
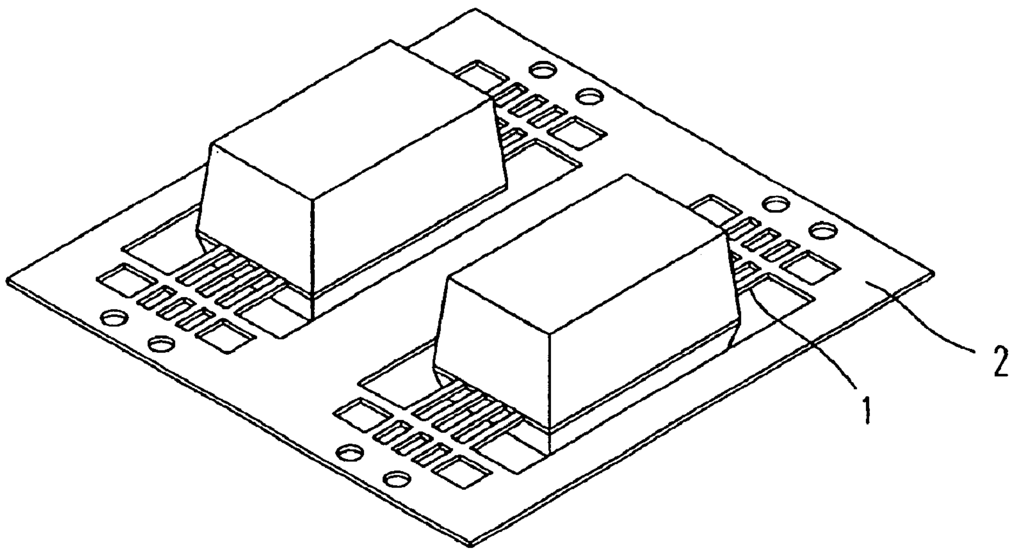
Fig. 3(PRIOR ART)
FIG. 3 is a perspective view showing a semi-product after being subject to a plastic molding according to prior art.
Figure 4:
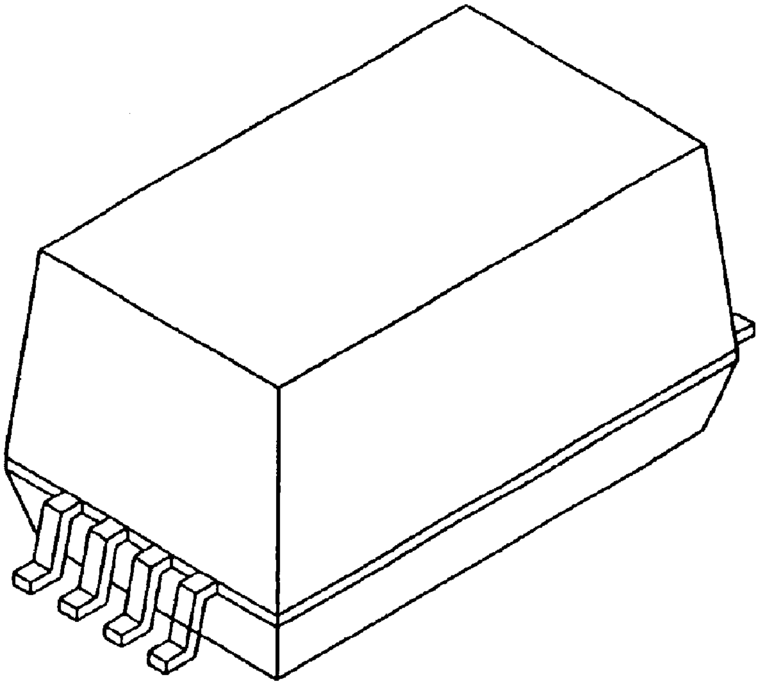
Fig. 4(PRIOR ART)
FIG. 4 is a perspective view showing a product according to prior art.
Figure 5:
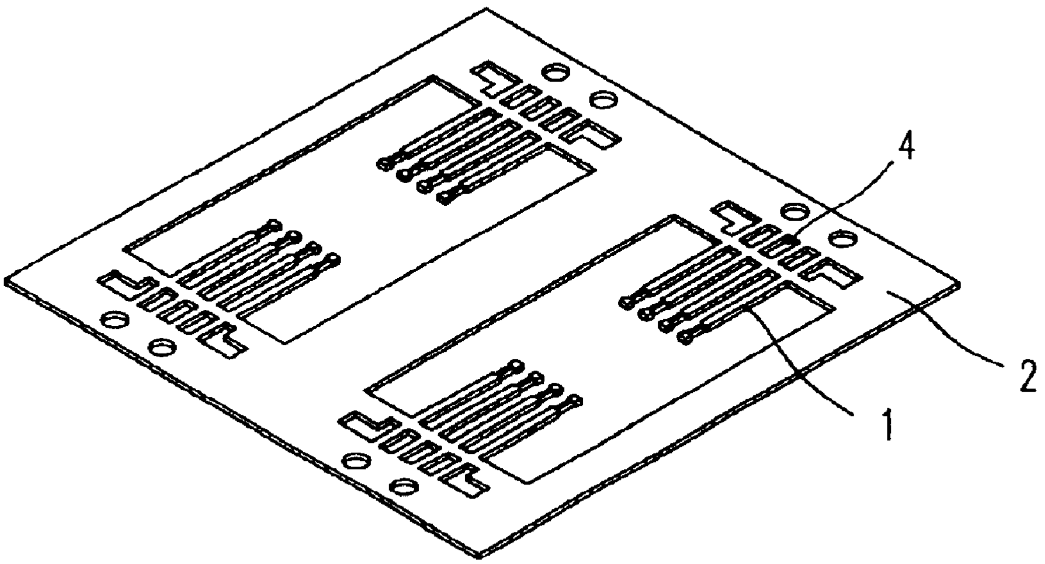
FIG. 5 is a perspective view showing a frame according to a preferred embodiment of the present invention.
Figure 6:
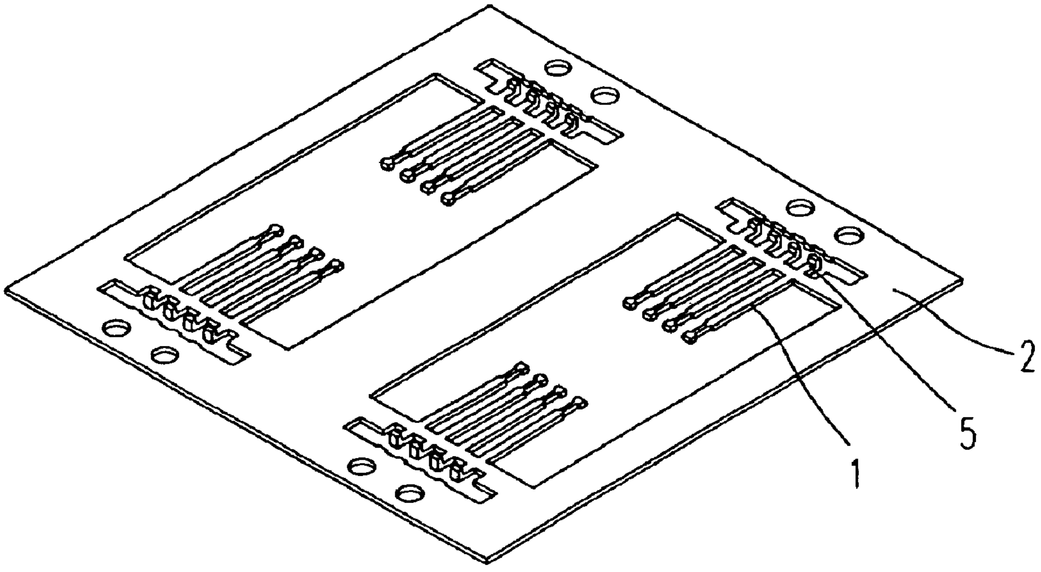
FIG. 6 is a perspective view showing a frame according to a preferred embodiment of the present invention, wherein the frame leads beyond the package area are cut and turned upwards by about 90 degrees.
Figure 7:
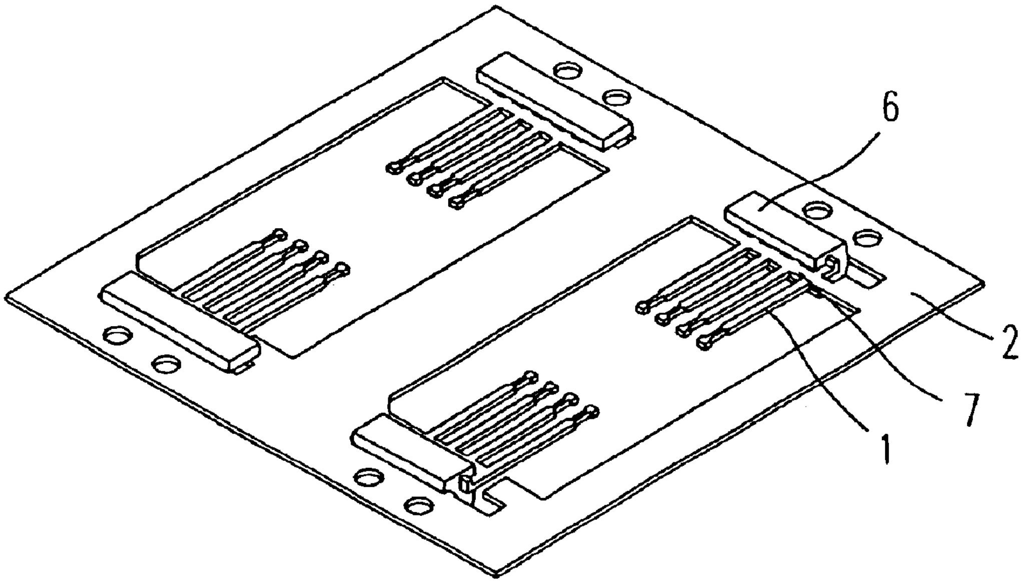
FIG. 7 is a perspective view showing a frame according to a preferred embodiment of the present invention, wherein an insulating block is formed.

With reference now to FIG. 5, the frame according to the present invention has the same structure as that shown in FIG. 1, except that the former has larger surface. On one side of the package area, each of the frame leads close to the positioning openings 4 is then cut and turned upwards by about 90 degrees to form a pre-bent lead 5, as can be seen from FIG. 6. Subsequently, the pre-bent lead 5 is embedded in an insulating block 6 by a plastic molding process, as is depicted in FIG. 7. Owing to the broader surface of the frame body, the insulating block is fixed well thereon. Furthermore, the pre-bent leads can help fix the insulating block 6 on the frame body.

Figure 8:
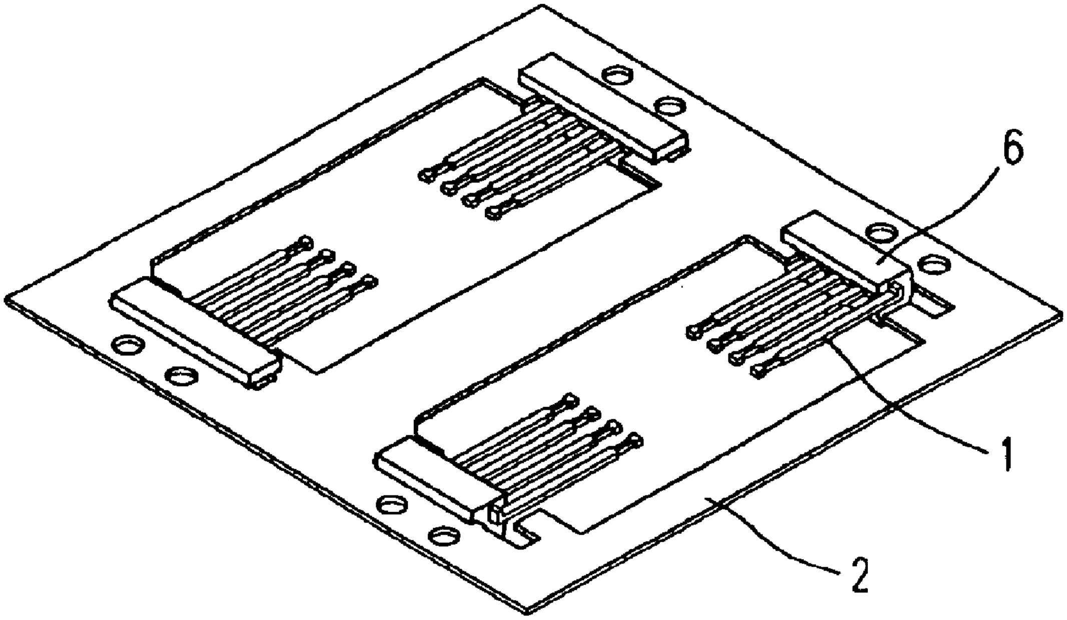
FIG. 8 is a perspective view showing a frame according to a preferred embodiment of the present invention, wherein a connecting arm is partially cut for insulating the plurality of frame leads against each other.

The connecting arm 7 is subsequently subjected to partially cutting for insulating the plurality of frame leads against each other, as can be seen in FIG. 8.

Figure 9:
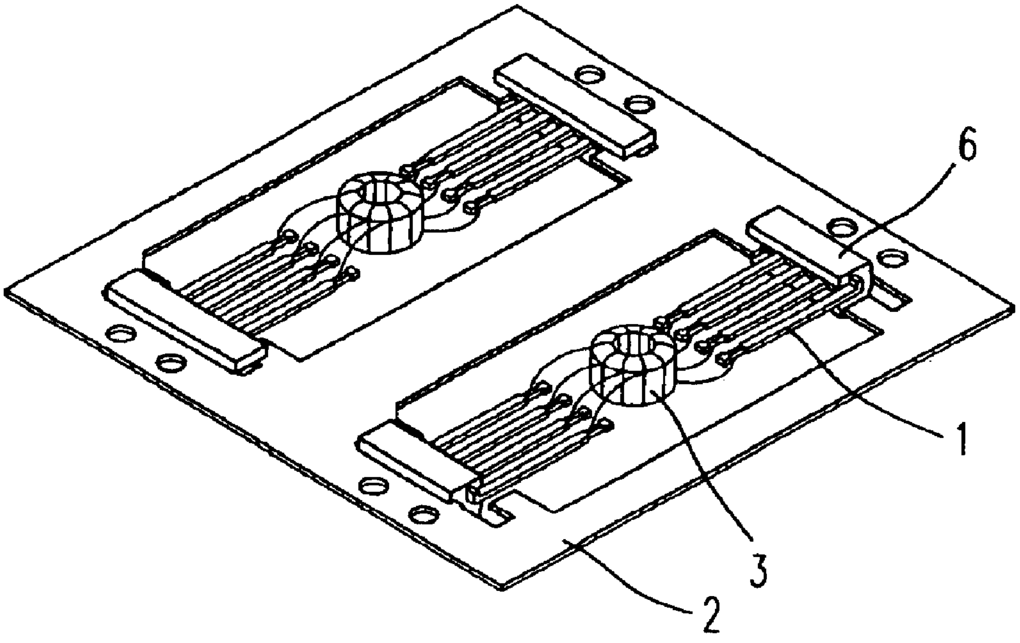
FIG. 9 is a perspective view showing a semi-product before being subject to a plastic molding according to a preferred embodiment of the present invention, wherein the electronic device is connected to the frame leads.
Figure 10:
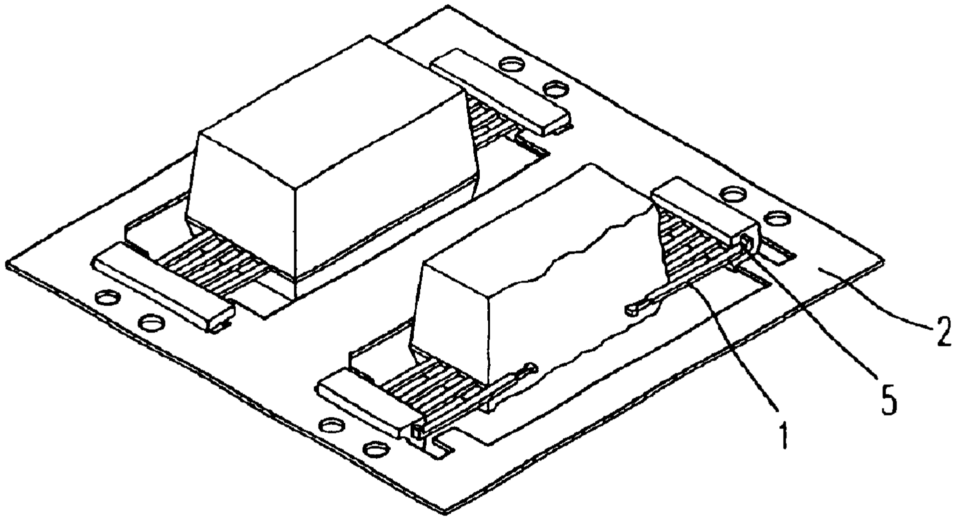
FIG. 10 is a perspective view showing a semi-product after being subject to a plastic molding according to a preferred embodiment of the present invention.

Referring to FIG. 9, a semi-product before being subject to a plastic molding is formed by interconnecting the electronic device 3 and the frame leads 1 through a plurality of metal wires. It is clearly shown that the plurality of frame leads connected to the electronic device 3 of the semi-product are insulated with each other; therefore, the electronic characteristics of the semi-product can be measured before being subject to a plastic molding. Hence, the defective semi-products caused by welding are readily inspected. A defective component of the semi-product inspected before being subject to a plastic molding can be replaced by reworking of the semi-product. After conducting a plastic molding process, the semi-product is formed as shown in FIG. 10.

A final product is formed after the semi-product undergoes the typical back-end procedures, for example, the cutting of the frame portion and the bending of the leads. It is apparent that the yield and reliability of the product will be considerably increased.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structure.

What is claimed is:

1. A method for packing an electronic device comprising:

providing a frame having a package area where said electronic device is disposed therein, a connecting arm and a plurality of frame leads with one end of each of said frame leads cut off from said frame which are connected to the connecting arm;

forming an insulating block with said one end of each of said frame leads and a part of said frame embedded on one side of said package area;

partially cutting said connecting arm to insulate said plurality of frame leads against each other;

electrically connecting said electronic device to said plurality of frame leads through a plurality of wires to form a semi-product having said electronic device, said frame leads, and said wires;

pre-measuring an electric characteristic of said semi-product before being subject to a plastic molding; and conducting a plastic molding process to pack said semi-product.

2. The method according to claim 1, wherein said electronic device is a coil.

3. The method according to claim 1, wherein said frame is made of metal.

4. The method according to claim 1, wherein said package area is disposed in the center of said frame and in a shape of a rectangle.

5. The method according to claim 1, wherein said insulating block is formed by a plastic molding process.

6. The method according to claim 1, wherein said pre-measuring step further comprises a step of replacing a defective component of said semi-product.

7. The method according to claim 1, wherein said conducting step further comprises a step of cutting off said packed semi-product from said frame to form a product.

8. A method for packing an electronic device comprising steps of:

providing a frame having a package area where said electronic device is disposed therein, a connecting arm connected to said frame, and a plurality of frame leads connected to said connecting arm;

forming an insulating block with said one end of each of said frame leads embedded on one side of said package area;

partially cutting said connecting arm to insulate said plurality of frame leads against each other;

electrically connecting said electronic device to said plurality of frame leads to form a semi-product having said electronic device and said frame leads; and conducting a plastic molding process to pack said semi-product before being subject to a plastic molding.

9. The method according to claim 8, wherein said electrically connecting step further comprises a step of pre-measuring an electric characteristic among said frame leads and said electronic device before said semi-product being subject to a plastic molding.

10. The method according to claim 9, wherein said pre-measuring step further comprises a step of replacing a defective component of said semi-product.

11. The method according to claim 8, wherein said conducting step further comprises a step of cutting off said packed semi-product from said frame to form a product.

12. The method according to claim 8, wherein said electronic device is a coil.

13. The method according to claim 8, wherein said frame is made of metal.

14. The method according to claim 8, wherein said package area is disposed in the center of said frame and in a shape of a rectangle.

15. The method according to claim 8, wherein said insulating block is formed by a plastic molding process.

16. A method for packing an electronic device comprising steps of:

providing a frame having a package area where said electronic device is disposed therein, a connecting arm, and a plurality of frame leads which are connected to said connecting arm;

forming an insulating block with one end of each of said frame leads embedded on one side of said package area;

partially cutting said connecting arm to insulate said plurality of frame leads against each other; and electrically connecting said electronic device to said plurality of frame leads.

17. The method according to claim 16, wherein said electrically connecting step further comprises a step of pre-measuring an electric characteristic among said frame leads and said electronic device before being subject to a plastic molding.

18. The method according to claim 16, wherein said providing step further comprising a step of cutting off one end of each of said frame leads originally connected to said frame.

19. The method according to claim 18, wherein said cutting step further comprises a step of turning said one end of each of said frame leads.

20. The method according to claim 16, wherein said method further comprises a step of conducting a plastic molding process to pack said electronic device and said frame leads.

* * * * *